(12) United States Patent
Takase et al.

(10) Patent No.: US 8,771,563 B2
(45) Date of Patent: *Jul. 8, 2014

(54) MANUFACTURING METHOD OF OPTICAL ELECTRONIC COMPONENTS AND OPTICAL ELECTRONIC COMPONENTS MANUFACTURED USING THE SAME

(75) Inventors: Shinji Takase, Kyoto (JP); Kazuki Kawakubo, Kyoto (JP); Yohei Onishi, Kyoto (JP)

(73) Assignee: Towa Corporation, Kyoto (JP)

(*) Notice: Subject to any disclaimer, the term of this patent is extended or adjusted under 35 U.S.C. 154(b) by 740 days.

This patent is subject to a terminal disclaimer.

(21) Appl. No.: 11/702,636

(22) Filed: Feb. 6, 2007

(65) Prior Publication Data

US 2007/0138696 A1 Jun. 21, 2007

Related U.S. Application Data

(62) Division of application No. 11/178,400, filed on Jul. 12, 2005, now Pat. No. 7,811,491.

(51) Int. Cl.
*B29C 43/18* (2006.01)
*B29C 43/56* (2006.01)

(52) U.S. Cl.
USPC .......................................... 264/2.3

(58) Field of Classification Search
USPC ............................. 264/2.3, 272.14
See application file for complete search history.

(56) References Cited

U.S. PATENT DOCUMENTS

| 2,797,179 | A | | 6/1957 | Reynolds et al. |
| 4,944,908 | A | | 7/1990 | Leveque et al. |
| 5,147,821 | A | | 9/1992 | McShane et al. |
| 5,169,677 | A | | 12/1992 | Sangyoji et al. |
| 5,238,640 | A | | 8/1993 | Masui et al. |
| 5,622,667 | A | | 4/1997 | Fujiyama et al. |
| 5,635,115 | A | | 6/1997 | Konishi et al. |
| 5,725,891 | A | | 3/1998 | Reid, Jr. |
| 5,744,087 | A | * | 4/1998 | Williams et al. ........... 264/297.2 |
| 5,776,514 | A | | 7/1998 | Wu et al. |
| 5,783,220 | A | | 7/1998 | Osada et al. |

(Continued)

FOREIGN PATENT DOCUMENTS

| EP | 1 396 323 A1 | 3/2004 |
| JP | 61-001067 A | 1/1986 |

(Continued)

OTHER PUBLICATIONS

Notice of Grounds of Rejection mailed Jan. 19, 2010. Patent Application No. 095948/2007.

(Continued)

*Primary Examiner* — Ryan Ochylski
(74) *Attorney, Agent, or Firm* — Birch, Stewart, Kolasch & Birch, LLP

(57) ABSTRACT

There is provided a method of sealing and molding an optical device with resin by employing a die including a top piece, a bottom piece, an intermediate piece, and a mold release film pinched between the bottom and intermediate pieces. Thus, tensioned as prescribed to cover the bottom piece's cavity, when the bottom piece is heated, the mold release film expands and thus closely contacts the cavity's entire surface along the cavity's geometry so that the optical device can be sealed in transparent set resin shaped as desired.

10 Claims, 6 Drawing Sheets

(56) References Cited

U.S. PATENT DOCUMENTS

| | | | |
|---|---|---|---|
| 5,830,402 A | 11/1998 | Harada et al. | |
| 5,846,477 A | 12/1998 | Hotta et al. | |
| 5,876,765 A | 3/1999 | Hinterlechner | |
| 5,942,168 A | 8/1999 | Ichikawa et al. | |
| 6,080,354 A * | 6/2000 | Miyajima | 264/511 |
| 6,344,162 B1 * | 2/2002 | Miyajima | 264/272.14 |
| 6,350,113 B1 * | 2/2002 | Miyajima | 425/89 |
| 6,478,562 B1 | 11/2002 | Miyajima | |
| 6,531,328 B1 | 3/2003 | Chen | |
| 6,599,768 B1 | 7/2003 | Chen | |
| 6,652,799 B2 * | 11/2003 | Seng et al. | 264/511 |
| 6,734,571 B2 * | 5/2004 | Bolken | 257/787 |
| 6,743,389 B2 | 6/2004 | Miyajima et al. | |
| 6,764,290 B2 | 7/2004 | Stangl et al. | |
| 6,787,093 B2 | 9/2004 | Kiritani | |
| 6,881,611 B1 | 4/2005 | Fukasawa et al. | |
| 6,881,980 B1 | 4/2005 | Ting | |
| 6,921,926 B2 | 7/2005 | Hsu | |
| 6,940,101 B2 | 9/2005 | Yano et al. | |
| 6,949,772 B2 | 9/2005 | Shimizu et al. | |
| 6,963,166 B2 | 11/2005 | Yano et al. | |
| 6,977,188 B2 | 12/2005 | Takase | |
| 6,998,647 B2 | 2/2006 | Morimoto et al. | |
| 7,026,661 B2 | 4/2006 | Murano | |
| 7,056,770 B2 | 6/2006 | Uragami et al. | |
| 7,084,435 B2 | 8/2006 | Sugimoto et al. | |
| 7,095,053 B2 | 8/2006 | Mazzochette et al. | |
| 7,115,979 B2 | 10/2006 | Park et al. | |
| 7,128,562 B2 | 10/2006 | Doi et al. | |
| 7,452,737 B2 | 11/2008 | Basin et al. | |
| 7,473,933 B2 | 1/2009 | Yan | |
| 7,514,867 B2 | 4/2009 | Yano et al. | |
| 2001/0008775 A1 | 7/2001 | Yamamoto | |
| 2002/0014693 A1 * | 2/2002 | Pollock | 257/724 |
| 2002/0094606 A1 | 7/2002 | Fukutomi et al. | |
| 2002/0123163 A1 | 9/2002 | Fujii | |
| 2002/0163006 A1 | 11/2002 | Yoganandan et al. | |
| 2002/0187570 A1 | 12/2002 | Fukasawa et al. | |
| 2002/0195744 A1 | 12/2002 | Otsuki et al. | |
| 2003/0039717 A1 | 2/2003 | Hwang et al. | |
| 2003/0160256 A1 | 8/2003 | Durocher et al. | |
| 2004/0009260 A1 | 1/2004 | Gabriel | |
| 2004/0048416 A1 * | 3/2004 | Takase | 438/106 |
| 2004/0051185 A1 * | 3/2004 | Konishi et al. | 257/787 |
| 2004/0063840 A1 * | 4/2004 | Starkey | 524/442 |
| 2004/0101631 A1 | 5/2004 | Uragami et al. | |
| 2004/0161489 A1 | 8/2004 | Hwang et al. | |
| 2004/0180459 A1 | 9/2004 | Hsu | |
| 2004/0219700 A1 | 11/2004 | Silverbrook | |
| 2005/0074912 A1 | 4/2005 | Yamauchi et al. | |
| 2005/0074954 A1 | 4/2005 | Yamanaka | |
| 2005/0139846 A1 | 6/2005 | Park et al. | |
| 2005/0224830 A1 | 10/2005 | Blonder et al. | |
| 2006/0186576 A1 | 8/2006 | Takase et al. | |
| 2007/0013090 A1 | 1/2007 | Takase et al. | |
| 2007/0132135 A1 | 6/2007 | Takase et al. | |
| 2007/0138696 A1 | 6/2007 | Takase et al. | |
| 2008/0164482 A1 | 7/2008 | Obara et al. | |

FOREIGN PATENT DOCUMENTS

| | | |
|---|---|---|
| JP | 4-348088 A | 12/1992 |
| JP | 6000871 A | 1/1994 |
| JP | 2001-176902 A | 6/2001 |
| JP | 2001-203227 A | 7/2001 |
| JP | 2001-223285 A | 8/2001 |
| JP | 2002-36270 A | 2/2002 |
| JP | 2002-43345 A | 2/2002 |
| JP | 2002-314100 A | 10/2002 |
| JP | 2002-319711 A | 10/2002 |
| JP | 2002-368281 A | 12/2002 |
| JP | 2003-163382 A | 6/2003 |
| JP | 2003-324118 A | 11/2003 |
| JP | 2004-74461 A | 3/2004 |
| JP | 2004-88713 A | 3/2004 |
| JP | 2004/027880 A | 4/2004 |
| JP | 2004-98364 A | 4/2004 |
| JP | 2004-148621 A | 5/2004 |
| JP | 2004/200269 A | 7/2004 |
| JP | 2004/216558 A | 8/2004 |
| JP | 2004-233482 A | 8/2004 |
| JP | 2004/330697 A | 11/2004 |

OTHER PUBLICATIONS

Notice of Grounds of Rejection mailed Jan. 19, 2010. Patent Application No. 129395/2004.

Final Decision for Rejection mailed Mar. 1, 2011 for Patent Application No. 294980/2004.

Notice of Grounds of Rejection mailed Aug. 16, 2010 for Patent Application No. 294980/2004.

Notice of Grounds of Rejection mailed Nov. 16, 2010 for Application No. 294980/2004.

Office Action issued May 30, 2013 in related U.S. Appl. No. 11/652,502.

* cited by examiner

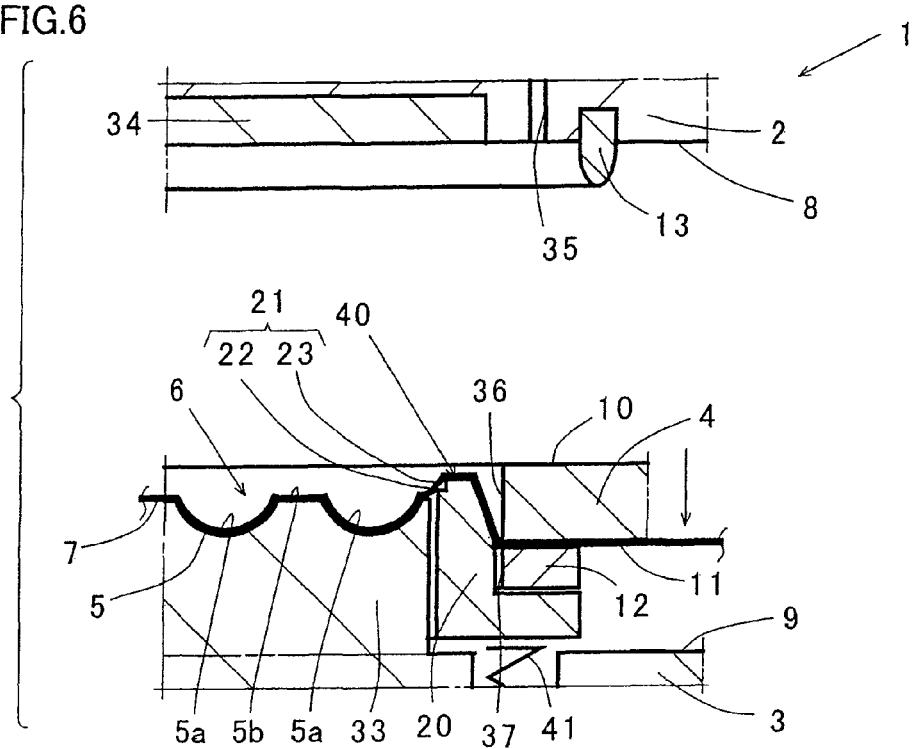
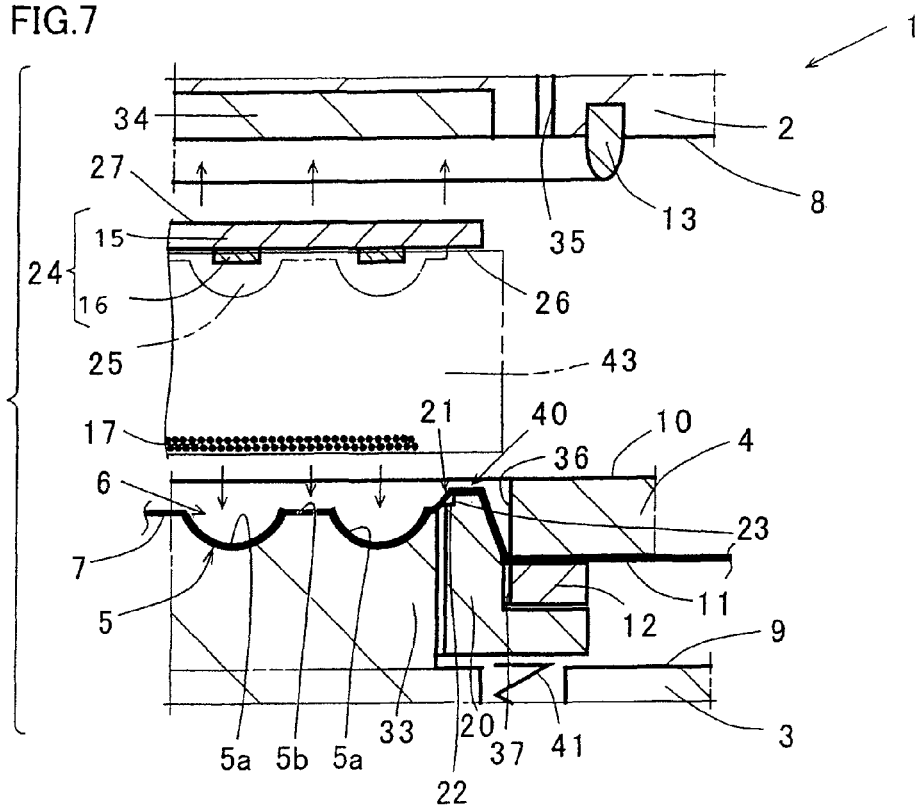

MANUFACTURING METHOD OF OPTICAL ELECTRONIC COMPONENTS AND OPTICAL ELECTRONIC COMPONENTS MANUFACTURED USING THE SAME

This application is a divisional of application Ser. No. 11/178,400, filed on Jul. 12, 2005, now U.S. Pat. No. 7,811,491 the entire contents of which are hereby incorporated by reference and for which priority is claimed under 35 U.S.C. §120.

BACKGROUND OF THE INVENTION

1. Field of the Invention

The present invention relates to methods of sealing and molding with resin an optical device serving as a part of an optical electronic component.

2. Description of the Background Art

Conventionally, for example as disclosed in Japanese Patent Laying-Open No. 61-1067, a 2-piece transfer molding die has been employed to seal an optical device with resin to produce an optical electronic component (or a molded product). The optical device thus sealed with resin is for example a light emitting diode (LED) mounted on a substrate. This LED chip is sealed with transparent resin acting as a lens. Employing such a 2-piece transfer molding die causes a problem depending on the transparent resin's properties, as follows:

The aforementioned transparent resin melts as the die is entirely heated. The melted resin is significantly low in viscosity and accordingly easily leaks out the die's cavity, resulting in resin flash.

Furthermore, the die has a path (e.g., a cull, a runner, a gate, a sprue or the like) to introduce the transparent resin into the cavity. As a result, the resin sealing the optical device and that present in the path would set in one piece.

Furthermore, the set resin at high temperature is small in hardness. As such, the set resin tends to adhere on the cavity's molding surface. As such, if the set resin is in contact with a molding surface having a curved surface corresponding to that configuring a lens, it is difficult to remove the set resin from the cavity's molding surface. Furthermore, if the lens is successfully removed from the die's molding surface, the lens tends to have a surface with protrusion and depression. As such, it is difficult to provide the lens with a mirror finished surface.

Furthermore, if the lens has voids formed therein, the lens unevenly transmits light, resulting in uneven brightness. This impairs the optical electronic component (or product) in quality.

Accordingly, the present inventors have been studying a method employing a transferless molding die, rather than the aforementioned transfer molding die, i.e., a die free of a resin path and thus reducing unnecessary resin to seal a product with resin. This method employs a mold release film to provide enhanced releasability between the die and the transparent resin and that between the optical electronic component and the die. Furthermore, the die's cavity is defined by a space vacuumed to prevent voids caused while the transparent resin is heated and melted.

Hereinafter the aforementioned method of sealing and thus molding with resin will more specifically be described.

The above described method employs a matrix substrate with a large number of surface mounted optical devices mounted thereon. Furthermore, this method employs a die composed of three pieces (i.e., a top piece, a bottom piece and an intermediate piece) and a mold release film. Furthermore, the die has an internal space vacuumed. This method can solve a problem that has not been overcome by a conventional 2-piece, transferless molding die, as disclosed in Japanese Patent Laying-Open No. 2004-98364. More specifically, it can prevent the mold release film from wrinkling. This is because the bottom and intermediate pieces can sandwich and thus tension the mold release film.

The 3-piece die disclosed in Japanese Patent Laying-Open No. 2004-98364, however, cannot cover the entire surface of the cavity of the bottom piece with the mold release film. Furthermore, if the cavity's molding surface is a curved surface, the curved surface cannot be appropriately covered with the mold release film. As a result, the optical device cannot be sealed in transparent resin shaped as desired.

SUMMARY OF THE INVENTION

The present invention contemplates a method of sealing and thus molding an optical device with resin that can provide an optical electronic component having an optical device sealed in transparent resin shaped as desired.

The present method employs a die including a first piece, a second piece having a cavity and opposite to the first piece and a third piece arranged between the first and second pieces, and a mold release film covering the cavity to seal and mold an optical device in the cavity with resin, including the steps of: attaching to the first piece a substrate having the optical device mounted thereon; bringing the mold release film sandwiched between the second and third pieces into contact with the cavity's entire surface along the cavity's geometry; closing the first, second and third pieces together and sealing the optical device in the cavity with melted resin; setting the melted resin to provide transparent set resin; separating the first, second and third pieces; and removing from the first piece the substrate having the optical device sealed in the transparent set resin.

In the present method the mold release film can be brought into contact with the cavity's entire surface along the cavity's geometry to provide an optical electronic component having an optical device sealed with transparent set resin shaped as desired.

Furthermore in the present method the second piece may be provided with an aspiration system aspirating and thus bringing the mold release film into contact with the cavity's entire surface to further ensure that the mold release film can closely contacts the cavity's entire surface.

Furthermore in the present method air may be blown toward the mold release film to bring the mold release film into contact with the cavity's entire surface. This can also further ensure that the mold release film is brought into contact with the cavity's entire surface.

Furthermore in the present method the second piece may be heated to bring the mold release film into contact with the cavity's entire surface. This can also further ensure that the mold release film is brought into contact with the cavity's entire surface.

Furthermore the cavity desirably has a plurality of curved portions each corresponding to an optical device, and a flat portion allowing the plurality of curved portions to communicate with each other. This allows melted resin to flow from a curved portion retaining a large amount of resin into that retaining a small amount of resin to allow the plurality of curved portions to retain uniform amounts of resin, respectively.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 shows the cavity's entire surface with the mold release film in contact therewith.

FIG. 7 shows the cavity receiving resin.

DETAILED DESCRIPTION OF THE INVENTION

Hereinafter with reference to the drawings the present method of sealing and thus molding an optical device with resin will be described.

Figure 1:
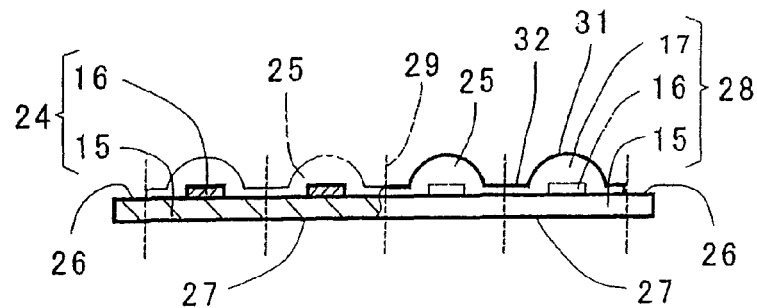
FIG. 1 is a cross section of a substrate having a plurality of optical devices mounted thereon.

In the present embodiment, the method employs an intermediate product 24, as shown in FIG. 1, composed of a circular or polygonal substrate 15 and a plurality of LED chips or similar optical devices 16 mounted on one surface of substrate 15. Intermediate product 24 is sealed with resin to provide an optical electronic component 28 including a sealing mold 25, the substrate's periphery 26, and a surface free of mounting 27.

Sealing mold 25 is formed of transparent resin 17 heated, melted and thereafter set. It is provided on one main surface of substrate 15. Furthermore, the substrate's periphery 26 is a region on one main surface of substrate 15 and outer than sealing mold 25. Furthermore, surface 27 is the other main surface of substrate 15 that is not provided with sealing mold 25.

Figure 2:
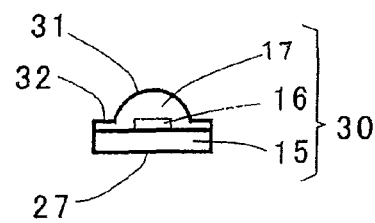
FIG. 2 is a cross section of an optical electronic component cut out of the FIG. 1 substrate.

Furthermore, optical electronic component 28 shown in FIG. 1 is cut at a portion 29 (or along a virtual line) to provide a plurality of optical electronic components 30 (or products) corresponding to a plurality of optical devices 16, as shown in FIG. 2.

Furthermore, sealing mold 25 has a semi-spherical, curving portion 31 corresponding to a lens, and a flat portion 32 parallel to the main surface of substrate 15 and surrounding curving portion 31.

Note that while in FIG. 1 a single optical device 16 corresponds to a single curving portion 31, alternatively a plurality of optical devices 16 may be contained in a single curving portion. Alternatively, optical device 16 may be contained in a polyhedron rather than curving portion 31.

Furthermore, desirably, transparent resin 17 is for example epoxy resin or silicone resin as it serves to protect optical device 16 as well as acts as a lens. Furthermore, transparent resin 17 may be resin in the form of liquid or a sheet, rather than granules.

Figure 3:
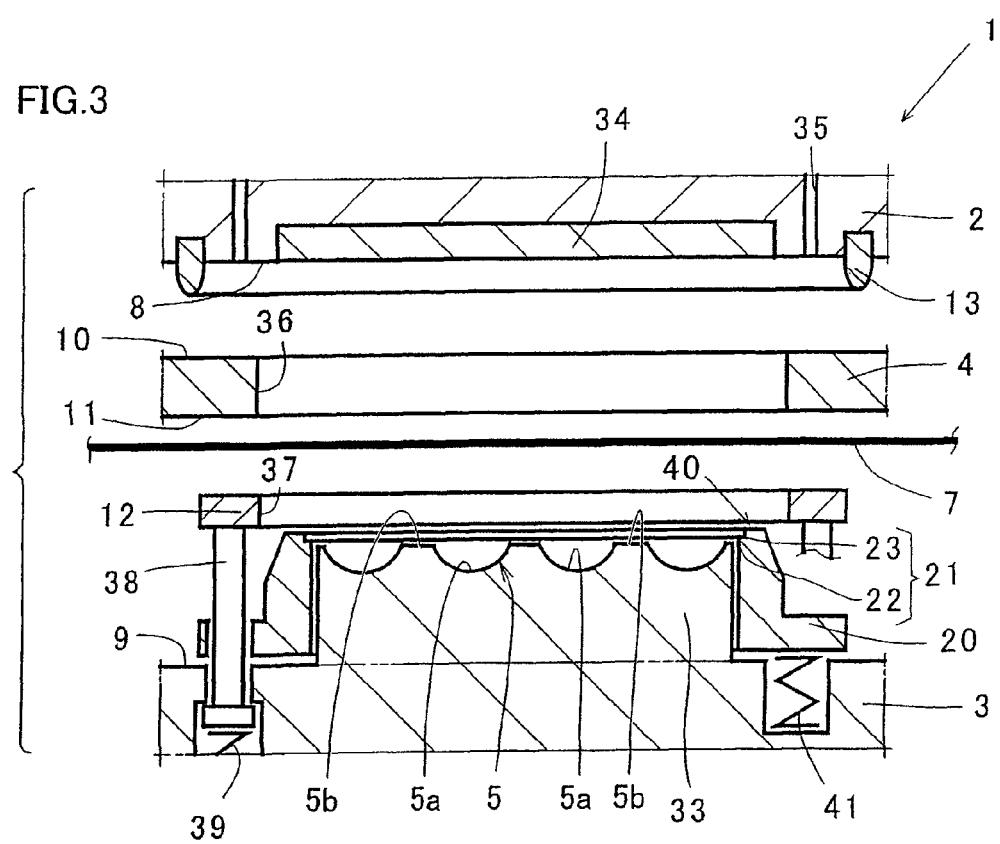
FIG. 3 is a cross section of a die employed in a method of sealing and thus molding with resin.

Furthermore in the present embodiment the present method does not employ a conventionally used, transfer molding die. Rather, as shown in FIG. 3, it employs a transferless molding die 1, which does not have a resin path, i.e., it does not have a resin path wastefully providing set resin. Die 1 is a 3-piece die composed of a top piece 2, a bottom piece 3 opposite top piece 2, and an intermediate piece 4 arranged between top and bottom pieces 2 and 3.

Bottom piece 3 has a protrusion 33 serving as a main body of bottom piece 3. Protrusion 33 has a surface 9 opposite top piece 2. Surface 9 has a cavity surface 5 defining a cavity space. Cavity surface 5 has a curved portion 5a corresponding to curving portion 31 of optical device 16, and a flat portion 5b corresponding to flat portion 32 of optical device 16. Furthermore, bottom piece 3 can move upward and downward. Furthermore, bottom piece 3 is provided with a pinching member 12 pinching mold release film 7, a cavity member 20 forming a portion of the cavity, and other members. Note that pinching member 12 is provided with a through hole 37.

Figure 4:
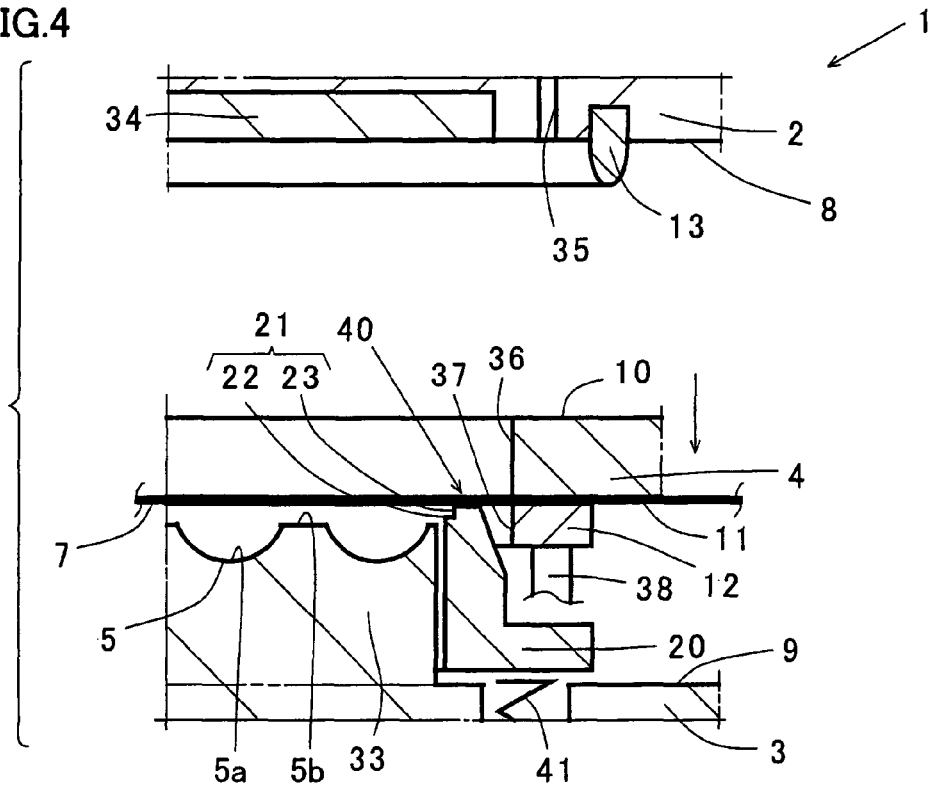
FIG. 4 shows the bottom and intermediate pieces sandwiching the mold release film.
Figure 5:
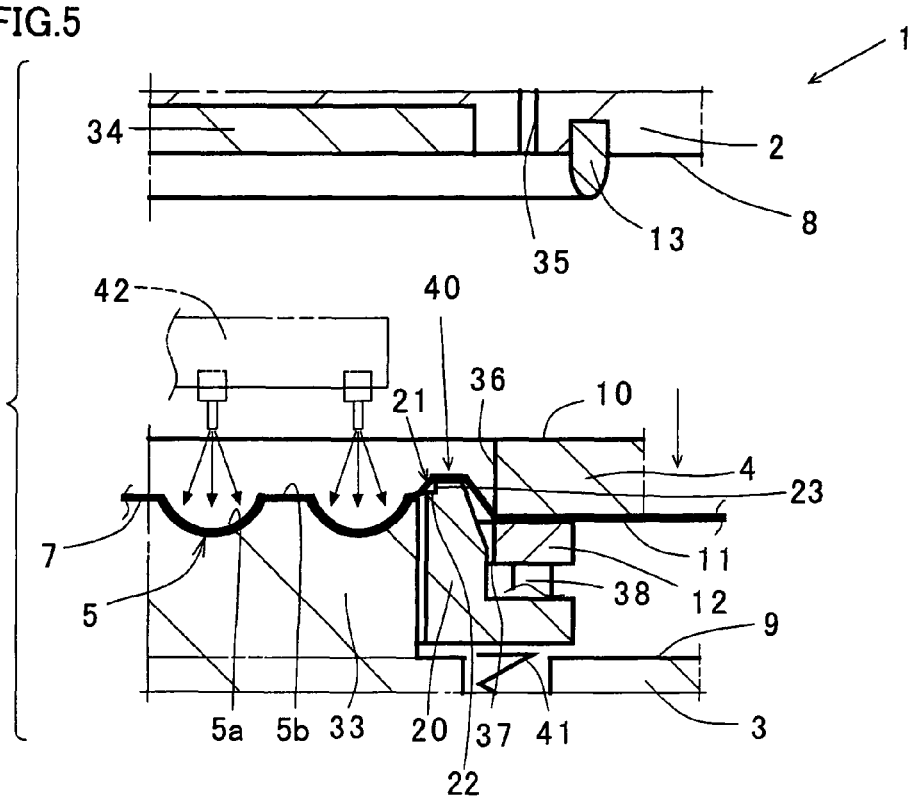
FIG. 5 shows an air blow system causing the mold release film contacting the cavity's entire surface.

Intermediate piece 4 has a surface 11 opposing the bottom piece and a surface 10 opposing the top piece and can move vertically. Furthermore, between surface 11 and cavity surface 5, mold release film 7 is supplied. Furthermore, when bottom piece 3 and intermediate piece 4 are closed together bottom piece 3 and intermediate piece 4 cooperate to sandwich mold release film 7. Furthermore, as shown in FIG. 3, intermediate piece 4 is provided with a through hole 36 extending from surface 10 to surface 11. When intermediate piece 4 moves downward, through hole 36 receives the bottom piece 3 protrusion 33 inserted therethrough, as shown in FIGS. 4-6, when the pinching member 12 through hole 37 also receives protrusion 33 inserted therethrough.

Furthermore, as shown in FIG. 3, top piece 2 has a substrate bearing portion 34, a sealing member 13, and a suction and exhaust hole 35. Furthermore, top piece 2 has a surface 8 positionally fixed. Substrate bearing portion 34 has attached thereon substrate 15 having optical device 16 mounted thereon such that the device faces downward. Furthermore, top piece 2 has a periphery provided with sealing member 13. When top piece 2 and intermediate piece 4 are closed together, sealing member 13 abuts against surface 10 of intermediate piece 4 moving upward. This isolates the space in die 1 from external atmosphere. Furthermore, suction and exhaust hole 35 provides communication between surface 8 and a vacuuming system (not shown). The air in the space in die 1 is aspirated by the vacuuming system and thus externally exhausted through suction and exhaust hole 35.

Furthermore, substrate bearing portion 34 attracts and releases substrate 15 to and from surface 8 as an air vent having an opening in surface 8 attains negative pressure and positive pressure, respectively. Note that between substrate bearing portion 34 and sealing member 13 a chuck system (not shown) may be provided to support the substrate's periphery 26.

Die 1 thus structured is used to seal and thus mold an optical device with resin in the present method, as will more specifically be described hereinafter. In the present method, mold release film 7 can be brought into contact with the cavity's entire surface (5 and 21) along the surface's geometry.

The present method is performed as follows: initially, top piece 2, intermediate piece 4 and bottom piece 3 are separated. Then, as shown in FIG. 3, mold release film 7 is inserted between intermediate piece 4 and bottom piece 3. Subsequently, intermediate piece 4 moves downward. Thus, as shown in FIG. 4, intermediate piece 4 and pinching member 12 pinch mold release film 7.

Note that pinching member 12 has a lower surface provided with a rod member 38. Pinching member 12 and rod member 38 are supported by a spring or similar resilient member 39 and can move upward and downward. At an opened position, as shown in FIG. 3, resilient member 39 is not contracted, and pinching member 12 assumes its topmost position. When intermediate piece 4 and bottom piece 3 are closed together, pinching member 12 and rod member 38 move downward and resilient member 39 is contracted.

Subsequently when intermediate piece 4 and pinching member 12, together pinching mold release film 7, move farther downward, then, as shown in FIG. 4, mold release film 7 abuts against the cavity member 20 topmost surface, or a portion 40 abutting against the substrate.

Furthermore, cavity member 20 is fit into protrusion 33 having cavity surface 5 to surround protrusion 33. Furthermore, cavity member 20 has a cross section in the form of the letter L composed of a vertical portion and a horizontal portion.

The cavity member 20 vertical portion includes portion 40 abutting against the substrate's periphery 26 with mold release film 7 interposed, the cavity's circumferential surface 22 located at a circumference of cavity surface 5, and the cavity's side surface 23 connecting portion 40 and the cavity's circumferential surface 22 together.

Furthermore, the cavity member 20 horizontal portion includes a top surface bearing pinching member 12, and a bottom surface abutting against surface 9 and a resilient member 41 fitted into a recess provided in bottom piece 3.

Note that in the present embodiment the cavity member 20 cavity surface 21 and the protrusion 33 cavity surface 5 define the cavity's entire surface.

Then, intermediate piece 4 and the bottom piece 3 pinching member 12 together pinching mold release film 7 move farther downward and die 1 goes through a position as shown in FIG. 5 and then assumes that shown in FIG. 6, when the intermediate piece 4 surface 11 opposite the bottom piece is positionally lower than the cavity member 20 portion 40. In that condition, intermediate piece 4 and bottom piece 3 are closed together and the cavity's space 6 is thus formed. Furthermore, a bottom surface of pinch member 12 and a top surface of the horizontal portion of cavity member 20 abut against each other, while a bottom surface of the horizontal portion of cavity member 20 and surface 9 still do not contact each other and the cavity member 20 resilient member 41 is still not contracted.

Furthermore, in that condition, die 1 is heated, and mold release film 7 accordingly extends. As a result, of mold release film 7, a portion located inner than portion 40 closely contacts the cavity's entire surface (5 and 21). More specifically, mold release film 7, receiving heat from bottom piece 3, closely contacts curved portion 5a and flat portion 5b of cavity surface 5 corresponding to the lens's curving portion 31.

Furthermore, to ensure that mold release film 7 closely contacts the cavity's entire surface (5 and 21), desirably protrusion 33 and cavity member 20 are each provided with a film aspiration system (not shown) compulsively aspirating mold release film 7. A possible film aspiration system includes a large number of holes provided for each of protrusion 33 and cavity member 21 and having one end communicating with cavity surface 5 or 21, and a vacuum pump connected to the other end of the large number of holes. The vacuum pump can operate to attract mold release film 7 toward the cavity's entire surface (5 and 21) through the large number of holes to bring mold release film 7 into contact with the cavity's entire surface (5 and 21).

Furthermore, if the film aspiration system has a function of blowing out air, then after resin sealing completes when the die is opened the system can blow air against sealing mold 25 (or set resin 19) via mold release film 7 to help to remove optical electronic component 28 from cavity surface 5. This can eliminate the necessity of employing an eject pin to push out the optical electronic component, as conventional. Sealing mold 25 can thus be protected from damage.

Furthermore, to bring mold release film 7 into contact with the cavity's entire surface (5 and 21), an air blow system 42 blowing air downward toward mold release film 7 is desirably provided, as shown in FIG. 5. The blown air exerts pressure, which brings mold release film 7 into contact with the cavity's entire surface (5 and 21) such that the film does not wrinkle and can thus be placed along the cavity's entire surface.

Furthermore, providing both the aforementioned film aspiration system and air blow system 42 to die 1 can further ensure that mold release film 7 is brought into further closer contact with the cavity's entire surface (5 and 21). Note that mold release film 7 extends as it receives heat from bottom piece 3. Accordingly, desirably, mold release film 7 is excellent in heat resistance and durability.

Then, as shown in FIG. 7, a carrier 43 carries intermediate product 24 and transparent resin 17 between top piece 2 and intermediate piece 4. Carrier 43 may carry substrate 15 and transparent resin 17 separately or together. Furthermore, carrier 43 may include air blow system 42.

Figure 8:
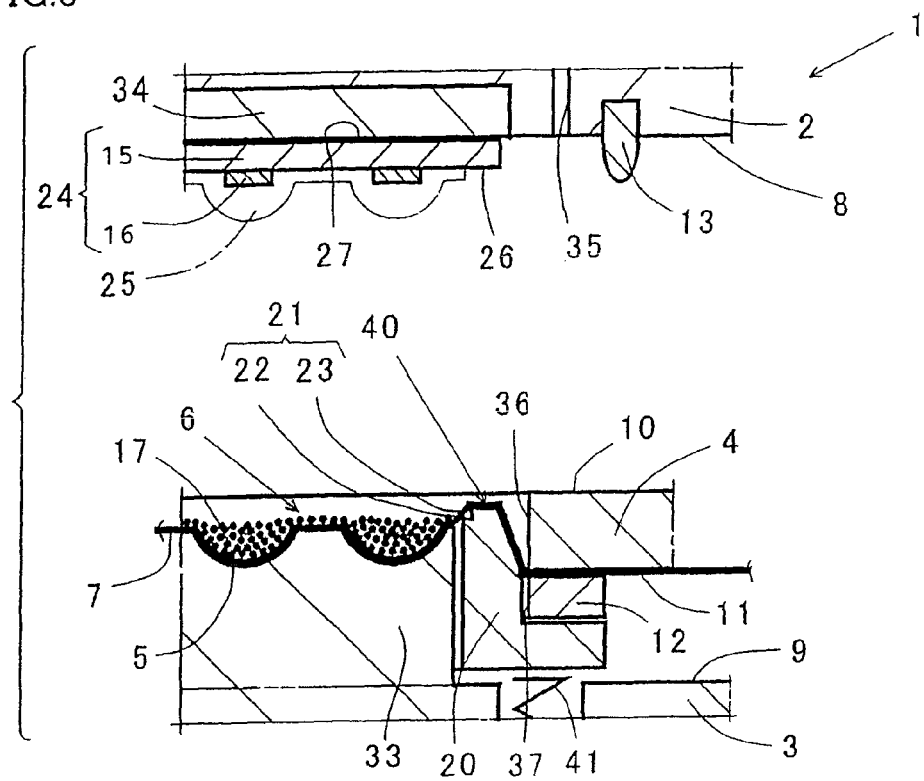
FIG. 8 shows a substrate and a resin material supplied in the die.

Then, as shown in FIG. 8, intermediate product 24 has surface 27 attached to substrate bearing portion 34. Note that die 1 is heated to a temperature required to melt transparent resin 17.

Figure 9:
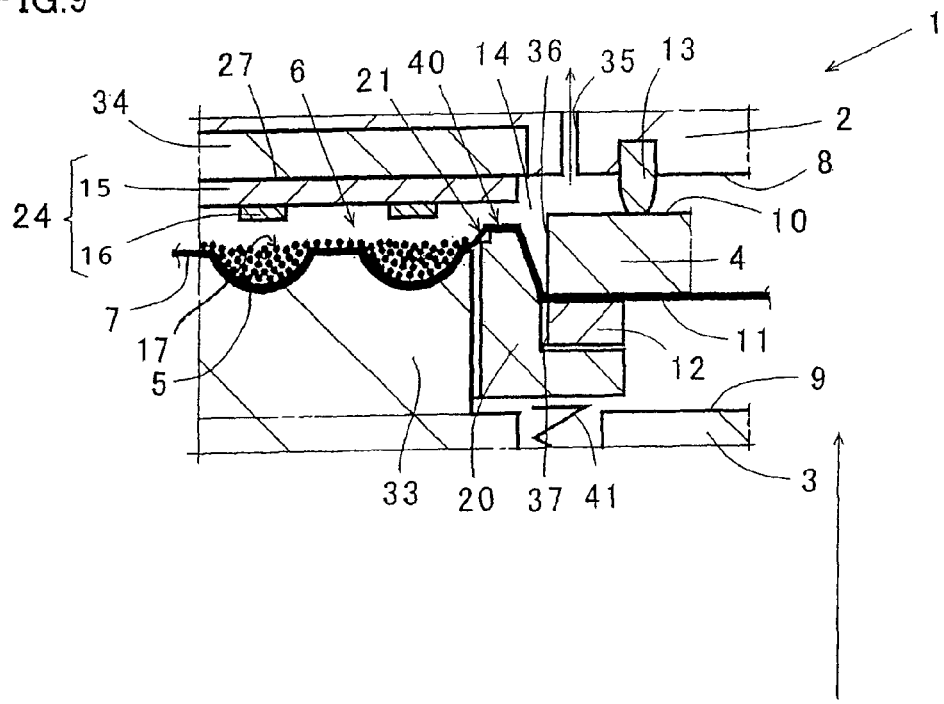
FIG. 9 shows the die vacuumed.

Attaching intermediate product 24 to surface 8, forming the cavity's space 6, preliminarily heating die 1 entirely, and supplying the cavity's space 6 with transparent resin 17, and the like, as aforementioned and shown in FIGS. 3-8, may be performed in any order, although they should be completed before a vacuuming step, as shown in FIG. 9 and described hereinafter.

Then, as shown in FIG. 9, the cavity's space 6 is supplied with transparent resin 17 and bottom piece 3 and intermediate piece 4 move upward toward top piece 2. Thus the top piece 2 sealing member 13 and the intermediate piece 4 surface 10 opposite the top piece abut against each other. Thus the cavity's space 6 is isolated from external atmosphere, and a space 14 isolated from external atmosphere is thus formed. Furthermore, substantially simultaneously, as indicated in FIG. 9 by an unbroken arrow, air is compulsively exhausted through suction and exhaust hole 35 communicating with the vacuuming system. Transparent resin 17 in the cavity's space 6 is not required to be melted when the die assumes the FIG. 9 position: it is only required to be melted when the die assumes the FIG. 10 position.

Figure 10:
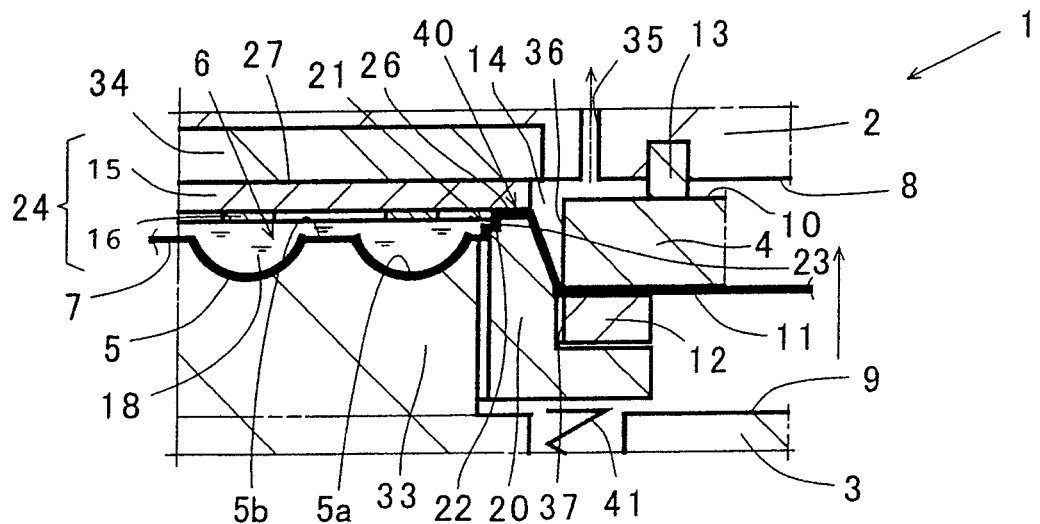
FIG. 10 shows an optical device immersed in melted resin.

While die 1 is vacuumed with the intermediate piece closed, die 1 may alternatively be vacuumed in steps between the FIG. 9 position closing the intermediate piece and the FIG. 10 position completely closing the die such that the bottom piece 3 and intermediate piece 4 operation is interrupted several times. Alternatively, die 1 may continuously be vacuumed such that rather than the bottom piece 3 and intermediate piece 4 operation is interrupted, bottom piece 3 and intermediate piece 4 ascend at a reduced rate after the intermediate piece is closed until the die is completely closed.

Then, as shown in FIG. 10, intermediate piece 4 and bottom piece 3 further, together ascend and portion 40 abuts against intermediate product 24 periphery 26 with mold release film 7 posed therebetween, when optical device 16 is immersed into melted resin 18 in the cavity's space 6. Furthermore, mold release film 7, bearing the weight of melted resin 18, is prevented from wrinkling and thus closely contacts the cavity's peripheral and side surfaces 22 and 23 and curved and flat portions 5a and 5b. This can provide sealing mold 25 having a satisfactory geometry corresponding to that of cavity surface 5.

Figure 11:
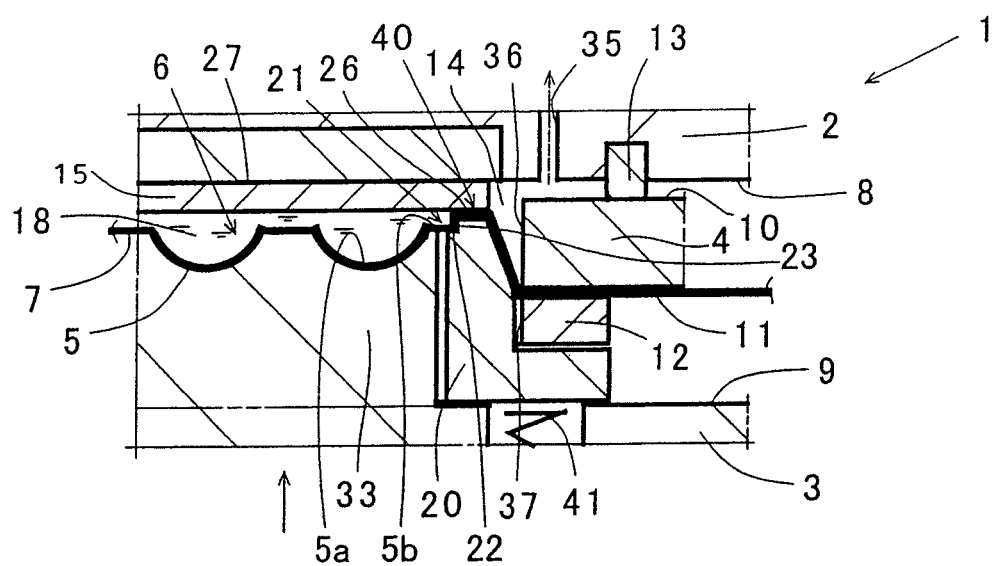
FIG. 11 shows the top piece and the intermediate and bottom pieces completely close together.

Then, as shown in FIG. 11, with intermediate product 24 abutting against portion 40, as shown in FIG. 10, bottom piece 3 has protrusion 33 alone moving upward to allow cavity surface 5 to have flat portion 5b substantially flush with the cavity's circumferential surface 22. In this condition, pinching member 12 and cavity member 20 abut against each other and the bottom surface of the horizontal portion of cavity member 20 and surface 9 abut against each other, and resilient members 39 (not shown; refer to FIG. 3) and 41 provided in bottom piece 3 are most contracted. This condition corresponds to die 1 completely closed.

Note that while in the FIG. 11 position showing die 1 completely closed, the cavity surface 5 flat portion 5b and the cavity's circumferential surface 22 are substantially flush with each other, alternatively, for some amount of resin in the cavity's space 6, cavity surface 5 may have flat portion 5b positionally higher or lower than the cavity's circumferential surface 22.

Furthermore, flat portion 5b may have any depths. For example, if cavity surface 5 does not have flat portion 5b, curved portion 5a may alone be supplied with a required amount of transparent resin 17.

Furthermore, a pressure sensor or similar measurement instrument (not shown) may be buried in protrusion 33 to monitor pressure closing die 1.

Furthermore, vacuuming the die is completed between the FIG. 9 position closing the intermediate piece and the FIG. 10 position completely closing the die, although desirably, the die is continuously vacuumed until the FIG. 10 position is assumed or the intermediate product is completely sealed with resin.

Then, although not shown, melted resin 18 sets and sealing mold 25 or set resin 19 is thus provided. Thus, optical electronic component 28 shown in FIG. 1, or a molded product completes.

Figure 12:
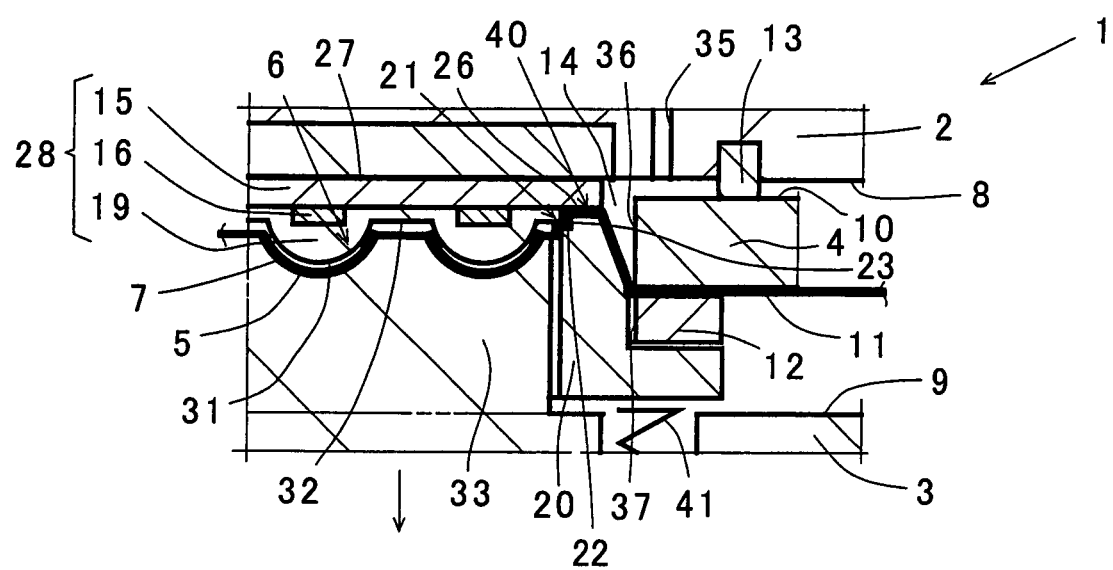
FIG. 12 shows an optical electronic component removed from the bottom piece.

Then, as shown in FIG. 12, top piece 2, and intermediate and bottom pieces 4 and 3 are separated, and bottom piece 3 has protrusion 33 alone moving downward. Accordingly, cavity surface 5 has flat portion 5b moving to be lower than the cavity's circumferential surface 22. This forms a gap between set resin 19 and mold release film 7 and optical electronic component 28 is removed from cavity surface 5. In that condition, top piece 2, and intermediate piece 4 and bottom piece 3 are further separated. Subsequently, optical electronic component 28 is removed from top piece 2 by carrier 43 (not shown; refer to FIG. 7). Desirably, carrier 43 has a system cleaning the used mold release film 7 when optical electronic component 28 is removed from die 1.

The method of sealing and thus molding optical device 16 with resin, as described above, can achieve both an effect obtained by using mold release film 7 and an effect obtained by vacuuming the die, as well as bring mold release film 7 into contact with the cavity's entire surface (5 and 21).

Note that while in the present embodiment a fixed top piece 2 and vertically movable intermediate and bottom pieces 4 and 3 form die 1, top piece 2 and intermediate piece 4 may be movable and bottom piece 3 may be fixed, and the role of top piece 2 and that of bottom piece 3 may be vice versa. Furthermore, top piece 2, intermediate piece 4 and bottom piece 3 are not limited to the above described structure and may have any structure that allows molding with resin, as described above.

Furthermore, while transparent resin 17 is composed of granular resin, it may alternatively be composed of liquid resin, powdery resin, or resin in the form of fine particles having a grain size larger than powdery resin and smaller than granular resin.

Furthermore, the intermediate product may be replaced with any of a wire bonding substrate with optical device 16 electrically connected to substrate 15 by a wire, a flip chip substrate with optical device 16 electrically connected to substrate 15 by a bump, a wafer substrate, and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A resin-sealing and molding method of optical devices employing a resin-sealing and molding die comprising a lower molding die provided with a cavity, an upper molding die opposing said lower molding die, and a release film covering a cavity surface of said cavity, and resin-sealing and molding a plurality of optical devices in said cavity, wherein said method comprises:
    attaching, to said upper molding die, a substrate before sealing to which said plurality of optical devices are attached so that said plurality of optical devices overlap with a plurality of concave portions provided in said cavity in plan view respectively;
    bringing said mold release film into contact with all surfaces of an entire cavity corresponding to a geometry of said cavity;
    inserting said plurality of optical devices into melted resin or resin in liquid form in said cavity by closing said resin-sealing and molding die;
    setting said melted resin or said resin in liquid form to provide transparent set resin;
    opening said resin-sealing and molding die; and
    removing said substrate sealed by said transparent set resin from said resin-sealing and molding die, wherein
    said lower molding die defines a communicating path communicating said plurality of concave portions with each other at an entire periphery of each of said plurality of concave portions,
    in said inserting step, said melted resin or said resin in liquid form moves between said plurality of concave portions through said communicating path so that a space inside said cavity is filled with said melted resin or said resin in liquid form when said resin-sealing and molding die is closed.

2. The resin-sealing and molding method of optical devices according to claim 1, further comprising:
    isolating said cavity from external atmosphere using a sealing member; and
    vacuuming said cavity that is isolated from external atmosphere.

3. The resin sealing and molding method of optical devices according to claim 1, wherein:
    in said step of bringing, said molding release film is brought into contact with said cavity's entire surface by suction.

4. The resin-sealing and molding method of optical devices according to claim 1, wherein:
    in said step of bringing, said mold release film is brought into contact with said cavity's entire surface by a blow of air.

5. The resin sealing and molding method of optical devices according to claim 1, wherein:

in said step of bringing, said mold release film is brought into contact with said cavity's entire surface by heating said lower molding die.

6. A resin-sealing and molding method of optical devices employing a resin-sealing and molding die including a lower molding die provided with a cavity and a release film covering a cavity surface of said cavity, and resin-sealing and molding a plurality of optical devices in said cavity, wherein said method comprises:

arranging a substrate, before sealing to which said plurality of optical devices are attached, so that said plurality of optical devices overlap with a plurality of concave portions provided in said cavity in plan view, respectively;

bringing said mold release film into contact with all surfaces of an entire cavity corresponding to a geometry of said cavity;

filling said cavity with melted resin or resin in liquid form by moving said melted resin or resin in liquid form through a communicating path by which said plurality of concave portions are communicated with each other at an entire periphery of each of said plurality of concave portions;

inserting said plurality of optical devices into said melted resin or said resin in liquid form in said cavity by closing said resin-sealing and molding die, and thereby, said melted resin and said resin in liquid form moves between said plurality of concave portions through said communicating path so that a space inside said cavity is filled with said melted resin or said resin in liquid form;

sandwiching said mold release film between a cavity member, provided outside said cavity, and a periphery of the substrate;

setting said melted resin or said resin in liquid form to provide transparent set resin;

opening said resin-sealing and molding die; and removing said substrate sealed by said transparent set resin from said resin-sealing and molding die.

7. The resin-sealing and molding method of optical devices according to claim 6, further comprising:

isolating said cavity from external atmosphere using a sealing member; and vacuuming said cavity that is isolated from external atmosphere.

8. The resin-sealing and molding method of optical devices according to claim 6, wherein in said bringing step, said molding release film is brought into contact with said cavity's entire surface by suction.

9. The resin-sealing and molding method of optical devices according to claim 6, wherein in said bringing step, said mold release film is brought into contact with said cavity's entire surface by a blow of air.

10. The resin-sealing and molding method of optical devices according to claim 6, wherein in said bringing step, said mold release film is brought into contact with said cavity's entire surface by heating said lower molding die.

\* \* \* \* \*